United States Patent [19]

Tanigaki et al.

[11] Patent Number: 5,294,600
[45] Date of Patent: Mar. 15, 1994

[54] SUPERCONDUCTING MATERIAL COMPRISING $Rb_xCs_yC_{60}$

[75] Inventors: Katsumi Tanigaki; Thomas Ebbesen; Sadanori Kuroshima; Junichiro Mizuki, all of Tokyo, Japan

[73] Assignee: NEC Corporation, Tokyo, Japan

[21] Appl. No.: 907,627

[22] Filed: Jul. 2, 1992

[30] Foreign Application Priority Data

Jul. 3, 1991 [JP] Japan ............... 3-163058
Jul. 3, 1991 [JP] Japan ............... 3-163059

[51] Int. Cl.$^5$ ............... C01B 31/00; H01L 39/12
[52] U.S. Cl. ............... 505/1; 252/500; 252/518; 423/414; 423/DIG. 39; 505/775; 505/800
[58] Field of Search ............... 505/1, 800, 775; 252/500, 518; 423/414, 439, DIG. 39

[56] References Cited

U.S. PATENT DOCUMENTS 5,223,479 6/1993 McCauley ............... 505/775

OTHER PUBLICATIONS

Murphy et al. "New Superconducting Cuprate Perouskites" Phys. Rev. Let. vol. 58 pp. 1885–1890, May 1987.
Fleming et al. "Relation of structure and superconducting Trans. Temp. in $A_3C_{60}$" Nature vol. 352 Aug. 1991.
Hebard et al., "Superconductivity at 18 K in Potassium-doped $C_{60}$", Letters to Nature, vol. 350, No. 18, pp. 600–601, Apr. 18, 1991.
Rosseinsky et al., "Superconductivity at 28 K in $Rb_xC_{60}$", Physical Review Letters, vol. 66, No. 21, pp. 2830–2832, May 27, 1991.
Holczer et al., "Alkali-Fulleride Superconductors: Synthesis, Composition, and Diamagnetic Shielding", Science, vol. 252, pp. 1154–1157, May 24, 1991.
Chen et al., "$(Rb_xK_{1-x})_3C_{60}$ Superconductors: Formation of a Continuous Series of Solid Solutions", Science, vol. 253, Aug. 23, 1991, pp. 886–888.
Tanigaki et al., "Superconductivity at 33K in $Cs_xRb_yC_{60}$", Nature, vol. 352, Jul. 18, 1991, pp. 222–223.
Kelty et al., "Superconductivity at 30K in caesium-doped $C_{60}$", Nature, vol. 352, Jul. 18, 1991, pp. 223–225.

Primary Examiner—Paul Lieberman
Assistant Examiner—John Boyd
Attorney, Agent, or Firm—Burns, Doane, Swecker & Mathis

[57] ABSTRACT

A superconducting material higher in superconducting transition temperature and superconducting volume ratio than any conventional one is provided, which comprises a fullerene doped with rubidium and cesium. This fullerene system superconducting material makes it possible to improve both the superconducting transition temperature and superconducting volume ratio by having rubidium and cesium doped thereinto compared with any conventional fullerene systems. If the chemical composition of this super conducting material is expressed as $Rb_xCs_yC_n$, x and y are arbitrary if an equation $x+y=3$ is satisfied, preferable to be $x=2$ and $y=1$, further preferable to be $x=1$ and $y=s$. The superconducting transition temperature Tc and superconducting volume ratio when $x=1$ and $y=2$ or $x=2$ and $y=1$ are superior to those when $x=3$ and $y=0$ or $x=0$ and $y=3$, respectively.

13 Claims, 1 Drawing Sheet

SUPERCONDUCTING MATERIAL COMPRISING $RB_xCS_yC_{60}$.

BACKGROUND OF THE INVENTION

1. Field of the Invention

This invention relates to a superconducting material and a method of producing the same and more particularly, to a superconducting material made of a mixture of a fullerene and alkali metal and a method of producing the same.

2. Description of the Prior Art

As a superconducting material conventionally and practically realized, metal/alloy system and compound system ones or the like are known. The superconducting material has been widely applied for electronic devices such as the Josephson element and the like and for coils to be used in a superconducting magnet. Out of which, additionally to the applications for the superconducting quantum interference device (SQUID) magnetometer and other precision instrumentations in which the high sensitivity and precision characteristics and low noise performance of the Josephson junction is advantageously utilized, it has been largely expected to be applied for computers in which the high response and low power consumption characteristics of the Josephson junction are noticeably emphasized.

Under such a circumstance, a series of fullerenes consisting of cluster molecules of carbon were recognized to exist by Kuroto and Smalley in 1985 and then, its isolative synthesization was reported by Kratschmer and others in 1990. In this case, a fullerene is defined as a carbon material having a closed polyhedral structure consisting of pentagons and hexagons only. For this, such a series of materials that consist of cluster molecules of carbon having plural carbon atoms polyhedrally disposed in a soccer-ball pattern (a series of $C_a$-system materials including $C_{60}$ and $C_{70}$) are known.

Recently, such a phenomenon that a mixture of fullerene and an alkali metal shows superconductivity upon passing through heat treatment has been confirmed and as a result, the fullerene has been suddenly attracting strong attention as a noticeable material for superconductivity in the future. A case in point is that such a phenomenon that a mixture of fullerene and potassium (K) shows superconductivity at or below 18 K. by heat treatment was reported by Hebard and others (see "Nature", Vol. 350, No. 18, pp. 600 to 601, 1991), which leads to the sudden recognition of the importance of fullerenes. Besides, such a phenomenon that a mixture of fullerene and rubidium (Rb) shows superconductivity at or below 28 K. by heat treatment was reported (see "Physical Review Letters", Vol. 66, No. 21, pp. 2830 to 2832, 1991). In these reports, a superconducting material is obtained by heat-treating a mixture of fullerene and alkali metal in a furnace and chemically structured so that electrons are doped from alkali metal atoms into carbon atoms of fullerene.

In addition, through a previous series of investigations, it has been though from such a trend that mixing cesium (Cs) as an alkali metal makes it possible to obtain further preferable results, and Holczer and others reported on their investigations that they tried using cesium as an alkali metal based on such trend (see "Science", vol. 252, pp. 1154 to 1157, 1991). In this case, however, according to their report, superconductivity is not observed on the cesium-added fullerene and it is considered that the reason for this is that cesium will be difficult to be entered as a dopant into the lattice space of the fullerene ($C_{60}$) used.

A series of reports shown above reveal that an alkali-metal-added fullerene is possibly employed as a superconducting material in the future. In this case, however, the above-proposed superconducting materials have a superconducting transition temperature Tc as low as 28 K. and yet, a superconducting volume ratio, which is defined as a volume ratio of the region that shows superconductivity and the total region, is as low as 7%, which means that these values attained therethrough are unsatisfactory.

In addition, with the production methods proposed in these reports, fullerene and alkali metal are not sufficiently mixed with each other, thus being disadvantageous in that a superconducting material with a large superconducting volume ratio cannot be obtained.

Thus, an object of this invention is to provide a superconducting material consisting of a mixture of a fullerene and an alkali metal and which has higher superconducting transition temperature and larger superconducting volume ratio than those of the above-described conventional ones.

Another object of this invention is to provide a method of producing a superconducting material which consists of a mixture of a fullerene and an alkali metal and can be provided with a larger superconducting volume ratio than those of the above-described conventional ones.

SUMMARY OF THE INVENTION

In the first aspect of this invention, a superconducting material is provided which is higher in superconducting transition temperature and superconducting volume ratio than conventional ones.

A superconducting material according to this invention features to comprise a fullerene having rubidium and cesium doped thereinto. Here, a fullerene is defined as already shown above.

When cesium is to be doped singly, it is difficult for it to be entered into the lattice space of a fullerene to be used, and on the other hand, when it is to be used mixed with rubidium, the cesium atom can be made to enter thereinto. Such a fullerene system superconducting material as above can be improved in both the superconducting transition temperature and superconducting volume ratio as compared with conventional fullerene systems.

In a second aspect of this invention, a production method of a superconducting material is provided.

This production method comprises at least one of the processes of: (a) mixing solid-phase an alkali metal or metals and a fullerene ultrasonically before heat treatment; (b) finely pulverizing a solid-phase fullerene before mixing with an alkali metal or metals; and (c) annealing a sintered body of an alkali metal or metals and a fullerene while heating and then cooling in a gradual manner.

According to the process (a), a fullerene and an alkali metal or metals, which are normally powdery or finely particulate, are mixed with each other ultrasonically prior to heat treatment. Accordingly, the mixing can be achieved uniformly when heat-treated, so that the electrons can sufficiently migrate from the alkali metal or metals to the fullerene, thus making it possible to increase the proportion of a region showing superconductivity. The ultrasonic treatment in this process can be realized by using an equipment having the same structure as that of known ultrasonic cleaner.

According to the process (b), a solid-phase fullerene when extracted is finely crystallized, but by further finely pulverizing with a mortar or the like to make it more amorphous, the atoms of the alkali metal or metals can diffuse uniformly into the fullerene lattice.

According to the process (c), the region of showing superconductivity can be developed largely and stably. The cooling rate in this process does not exceed about 1° C./min. as an example.

Figure 1:
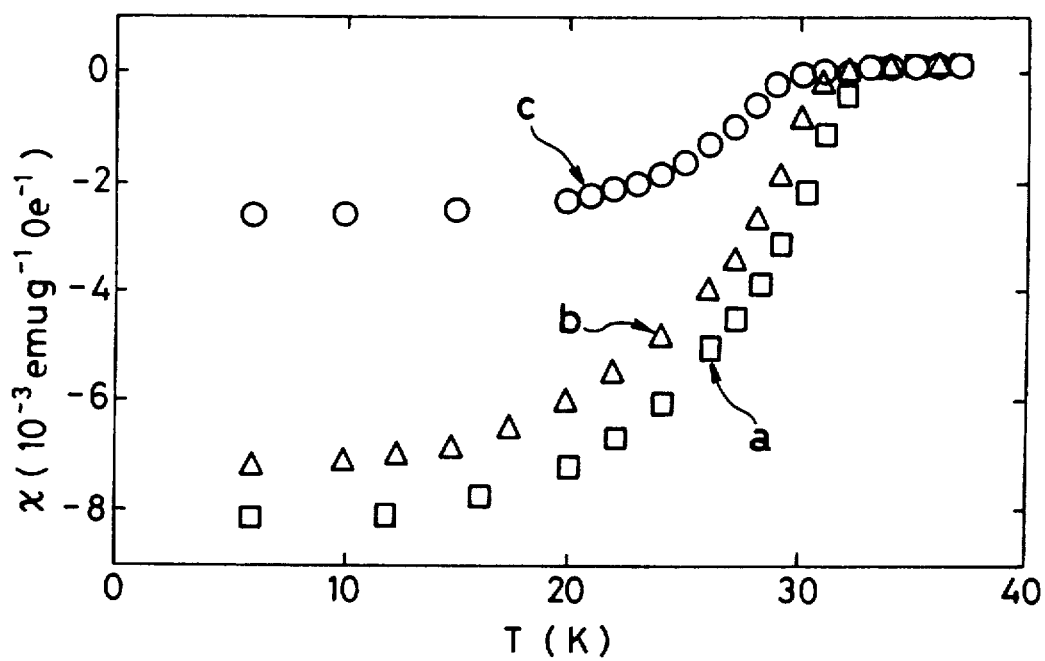
FIG. 1 graphically shows the results of SQUID measurements on magnetic susceptibilities of the fullerene system superconducting materials having Rb and Cs doped according to this invention.

DETAILED DESCRIPTION OF THE INVENTION (1) As described above, a superconducting material of this invention comprises a fullerene doped with rubidium and cesium.

Through investigative considerations upon Cs-added fullerene system superconducting materials, the inventors have concluded that the reason why the cesium atom cannot be entered into the lattice space of the fullerene is considered to be due to the fact that the ion radius of cesium is larger than the lattice space of fullerene crystal, so that if rubidium with a smaller ion radius than cesium is mixed into the fullerene together with the cesium and heat-treated so as to be doped into the fullerene simultaneously with each other, the smaller rubidium ion is entered first into the lattice space of fullerene crystal thereby to expand the space and as a result, the cesium atoms can be entered into the lattice spaces thus expanded. This invention was made based on the conclusion thus obtained.

According to this invention, rubidium and cesium are mixed into a fullerene thereby making it possible to dope the cesium into the fullerene, thus being capable of largely increasing the superconducting transition temperature Tc.

In addition, a superconducting material according to this invention makes it possible to largely enhance the superconducting volume ratio compared with a conventionally reported value of 1 to 7% obtained when only rubidium is mixed therewith. This is considered because if such fullerenes as $C_{60}$ and $C_{70}$ are of a face-centered lattice in crystal structure, there may exist two kinds of spaces different in magnitude from each other, so that the rubidium and cesium can be respectively made possible to occupy the spaces efficiently thereby obtaining a superconducting material superior in uniformity.

As explained above, a superconducting material of this invention is improved in both superconducting transition temperature Tc and superconducting volume ratio as compared with any conventional one, which means that it is largely effective as a new superconducting material.

As a fullerene to be used in this invention, $C_{60}$ and $C_{70}$ are preferable, but other fullerenes expressed as $C_n$ (n is a natural number) than those also can be used.

The chemical composition of a superconducting material of this invention is to be stoichiometrically composed of three parts the sum of rubidium and cesium and one part fullerene. Namely, if the chemical composition of this superconducting material is expressed as $Rb_xCs_yC_n$ (Rb: rubidium, Cs; cesium, Cn; fullerene), x and y are to be set so as to satisfy the following:

$$x-y=3,$$

where x and y are positive numbers. The amount of rubidium to be added is preferable to be smaller than that of cesium if it can quantitatively assist cesium to be doped.

In the composition $Rb_xCs_yC_n$ of this material, it is preferable to be $x=2$ and $y=1$, further preferable to be $x=1$ and $y=2$, which is because the case of being $x=1$ and $y=2$ results in an improvement in both superconducting transition temperature Tc and superconducting volume ratio compared with the case of being $x=2$ and $y=1$.

(2) A production method of a superconducting material of this invention comprises, as explained above, at least one of the processes of: (a) mixing a solid-phase fullerene and an alkali metal or metals by an ultrasonic method prior to heat treatment: (b) finely pulverizing a solid-phase fullerene prior to mixing with an alkali metal or metals; and (c) annealing a sintered body of a fullerene and an alkali metal or metals and under application of heat and thereafter gradually cooling. The inventors have succeeded in developing these procedures after repetition of experiments to obtain a superconducting material by mixing a fullerene with alkali metals.

In the process (a), a solid-phase (powdery or finely particulate in normal) fullerene and an alkali metal or metals are mixed with each other ultrasonically, so that an extremely uniform mixing structure can be provided when heat-treated, resulting in that the electrons are immigrating from the alkali metal or metals to the fullerene to increase the proportion of a region of showing superconductivity. This is considered due to the fact that the use of ultrasonic mixing process makes it possible for the alkali metal or metals to go into the lattice space of the fullerene during heat treatment.

The ultrasonic treatment can be realized by using an equipment having the same structure as that of known ultrasonic cleaner. This means that a solid-phase fullerene and an alkali metal or metals may be placed into an appropriate solution contained in a vessel and subjected to ultrasonic waves for mixing. The time of ultrasonic treatment is preferably ranged from about 10 to 60 minutes. The frequency and power of ultrasonic wave to be applied are not limited specifically, for example, 47 kHz and 150 W are a case in point.

By slightly increasing the temperature of the solution in the vessel, concretely, by setting it as to be ranged from about 40° to 50° C., the mixing effect can be further enhanced.

In the process (b), by finely pulverizing a solid-phase fullerene with a mortar or the like prior to mixing, the uniformity of the mixture can be extremely improved. The fullerene is finely crystallized when extracted and as a result, if mixing it under such finely crystallized condition at about 350° to 400° C., the alkali metal or metals are thermally diffused into the fullerene non-uniformly. However, according to the process (b) of this invention, the fullerene particles are made further smaller in size to become amorphous and as a result, the alkali metal or metals will be able to be diffused uniformly when thermally diffusing.

This process (b) can be easily realized by using known powdering equipment such as the mortar and the like.

The process (c) makes it possible to increase the proportion of a superconducting region. This is considered due to the fact that by lowering the temperature gradually, the superconducting region can be formed largely and stably. In this case, if the temperature is lowered rapidly, such a state of the sintered body that is being agitatively activated during heat treatment is directly solidified and as a result, the proportion of the superconducting region will be reduced. The cooling rate is at about 1° C./min. or less as an example.

According to the production method of this invention, a high density superconducting material can be made of a mixture of a fullerene and an alkali metal or metals, which means that its effects are extremely large.

EXAMPLES

Examples of this invention will be explained below concretely.

EXAMPLE 1

A series of fullerene generated by arc-discharging a carbon rod were contracted with benzene, then, treated with ether and thereafter, refined with a toluene/hexane mixing solvent using an alumina column (activity I), thus $C_{60}$ being obtained with a purity of 99.9% or more, which was confirmed using a mass spectrum so that the region exceeding 99.9% had a mass number of 720.

Next, the fullerene $C_{60}$ thus obtained was finely pulverized with a mortar to be made amorphous, then, in a glove box filled with helium, 9 mg of the $C_{60}$ powder thus prepared was contained in a quartz glass tube with a diameter of 5 mm and thereafter, mixed with the rubidium powder and cesium powder so as to be two parts rubidium to one part cesium on a stoichiometric ratio basis.

Subsequently, the quartz glass tube containing the mixture thus prepared was first subjected to the application of vacuum at a pressure of $10^{-2}$ Torr for evacuation, then, with a helium at 700 Torr was introduced and the tube sealed. Next, the quartz glass tube thus sealed was heated at 400° C. for 74 hours thereby finishing the doping of the alkali metals, or rubidium and cesium.

The results of SQUID measurements on the magnetization of the sample thus prepared are shown at (b) of FIG. 1. This test was carried out such that the sample was first cooled under zero magnetic field condition, then, applied with a magnetic field of 10 oersted (Oe) and measured the magnetization while the temperature was being increasingly changed from 4 K. to 38 K. From the change in magnetization in this test, the transition temperature Tc could be estimated to be about 31 K., which means that it is a 3 K. increase over that reportedly obtained when rubidium is doped singly. In addition, considering upon the diamagnetic characteristic obtained, the region that exhibited superconductivity was as high as 31 volume % of the total, which means that it is largely improved compared with any conventionally reported value.

COMPARATIVE EXAMPLE 1

In the same way as in Example 1, a test sample was prepared for the comparative purpose which has a stoichiometric composition of one part $C_{60}$ and three parts rubidium with no addition of cesium. As shown at (c) of FIG. 1, the transition temperature Tc of about 29 K. was obtained, thus being confirmed to be identical to the previously reported value of Tc. Besides, a superconducting volume ratio of about 10% was obtained.

EXAMPLE 2

In the same way as in Example 1, a test sample was prepared which has a stoichiometric composition of one part $C_{60}$, one part rubidium and two parts cesium. The results of SQUID measurements on magnetization of the sample thus prepared is shown at (a) of FIG. 1. From the change in magnetic susceptibility, the transition temperature Tc was estimated to be at about 33 K. and also, from considerations upon absolute value of diamagnetic susceptibility values, the superconducting volume ratio was estimated to exceed 50%.

COMPARATIVE EXAMPLE 2

In the same way as in Example 1, a test sample was prepared which has a stoichiometric composition of one part $C_{60}$ and three parts cesium with no addition of rubidium. This sample did not exhibit superconductivity.

Through the above examples and comparative examples, it can be found that in the stoichiometric composition $Rb_xCs_yC_{60}$, if $x=2$ and $y=1$, the Tc is occured at 31 K., and the superconducting volume ratio becomes 30% or more, and if $x=1$ and $y=2$, the Tc is at 33 K. and the superconducting volume ratio exceeds 50%, which means that the specimens prepared according to this invention can be largely improved in the characteristics that the Tc and superconducting volume ratio thus obtained were respectively largely increased compared with the $Tc=28$ K. and superconducting volume ratio$=7\%$ conventionally reported based on the stoichiometric composition of $x=3$ and $y=0$.

So far as the superconducting volume ratio is concerned, it is difficult to estimate it accurately because a superconducting material of this invention is a superconductor of the second kind and as a result, the lower limits are shown here.

EXAMPLE 3

A fullerene produced as a carbon powder through arc-discharging a carbon rod was extracted with a benzene solution thereby preparing a mixture of $C_{60}$ and $C_{70}$. This mixture was treated with ether and then, refined with a toluene/hexane mixing solvent using an alumina column thereby obtaining $C_{60}$ having a purity exceeding 99.9%. Then, 8.8 mg of the $C_{60}$ powder thus prepared was contained into a quartz glass tube and 4 mg of rubidium added thereto. Thereafter, the quartz glass tube was sealed at a helium pressure of 700 Torr and applied by ultrasonic wave for an hour in a solution to mix the $C_{60}$ and rubidium powders. The frequency and power of the applied ultrasonic wave were 47 kHz and 150 W respectively and the temperature of the solution was set in a range of 40° to 50° C. The quartz glass tube was heat-treated at 390° C. for 74 hours. After cooling, the SQUID measurements were performed to reveal its magnetic characteristics. As a result, the Meissner effect was confirmed to develop and the superconducting transition was also confirmed occur at 29 K. When analyzed, the superconducting volume ratio from the diamagnetic characteristics was recognized to be 30%, which means an improvement in superconducting volume ratio of over that of 10% in the conventionally produced ones.

EXAMPLE 4

The $C_{60}$ obtained in Example 3 was fully pulverized with a mortar, then, 8.5 mg of it was mixed with 4 mg of rubidium. The mixture thus obtained was contained in a quartz glass tube, then, sealed at a helium pressure of 700 Torr and thereafter, heat-treated at 390° C. for 74 hours. After being cooled, the SQUID measurements were performed to reveal its magnetic characteristics. As a result, the Meissner effect was confirmed to appear and the superconducting transition was also confirmed to occur at 29 K. When analyzed, the superconducting volume ratio from the diamagnetic characteristics was recognized to be 20%.

EXAMPLE 5

Here, 8.5 mg of the $C_{60}$ obtained in Example 3 was mixed with 4 mg of rubidium, then, contained in a quartz glass tube, then, sealed at a helium pressure of 700 Torr and thereafter, heat-treated at 390° C. for 74 hours. This was cooled to room temperature at a cooling rate of one degree per minute (1° C./min.). Then, the SQUID measurements were performed to reveal the magnetic characteristics. As a result, the Meissner effect was confirmed to appear and the superconducting transition was also confirmed to occur at 29 K. When analyzed, the superconducting volume ratio from the diamagnetic characteristics was recognized to be 20%.

EXAMPLE 6

The $C_{60}$ powder obtained in Example 3 was fully pulverized with a mortar, then, 8.5 mg of it was contained into a quartz glass tube, then, 1 mg of rubidium and 3 mg of cesium were added thereinto and thereafter, sealingly held at a helium ambient pressure of 700 mTorr. Next, an ultrasonic process was applied thereto at 50° C. for one hour in order to fully mix with the sample. Then, the sample thus prepared was heat-treated at 390° C. for 74 hours, and thereafter, gradually cooled at a cooling rate of 1° C./min. The SQUID measurements were carried out and confirmed the Meissner effect and the superconducting transition temperature at 33 K. Also, the superconducting volume ratio was confirmed to be as high as 60%.

Through the above examples 3 to 6, according to the method of this invention, it can be found that a superconducting material with a larger superconducting volume was provided.

What is claimed is:

1. A superconducting material consisting essentially of a fullerene whose chemical composition is $C_{60}$ and rubidium (Rb) and cesium (Cs) doped with said fullerene, the superconducting composition having a chemical composition of $Rb_xCs_yC_{60}$, where x and y are positive integers and the sum of $x+y$ is approximately 3.

2. A superconducting material as claimed in claim 1, wherein $x<y$.

3. A superconducting material as claimed in claim 1, wherein $x=2$ and $y=1$.

4. A superconducting material as claimed in claim 2, wherein $x=1$ and $y=2$.

5. A superconducting material consisting essentially of a fullerene whose chemical composition is $C_{60}$ and rubidium (Rb) and cesium (Cs) doped with said fullerene, atoms of said cesium being present in a lattice space of said fullerene.

6. A superconducting material as claimed in claim 5, wherein a chemical composition of said fullerene doped with rubidium and cesium is express as $Rb_xCs_yC_{60}$, wherein x and y are positive numbers and the sum of x and y is approximately 3.

7. A superconducting material as claimed in claim 5, wherein x and y satisfy an equation $x<y$.

8. A superconducting material as claimed in claim 6, wherein $x=2$ and $y=1$.

9. A superconducting material as claimed in claim 6, wherein $x=1$ and $y=2$.

10. A superconducting material as claimed in claim 8, wherein a transition temperature of said superconducting material is at least 31 K.

11. A superconducting material as claimed in claim 8, wherein a superconducting volume ratio of said material is at least 30%.

12. A superconducting material as claimed in claim 9, wherein a transition temperature of said superconducting material is at least 33 K.

13. A superconducting material as claimed in claim 9, wherein a superconducting volume ratio of said material is at least 50%.

* * * * *